US007626983B2

(12) United States Patent
Rhee

(10) Patent No.: US 7,626,983 B2
(45) Date of Patent: *Dec. 1, 2009

(54) METHOD OF CREATING OPTIMIZED TILE-SWITCH MAPPING ARCHITECTURE IN ON-CHIP BUS AND COMPUTER-READABLE MEDIUM FOR RECORDING THE SAME

(75) Inventor: Chae-Eun Rhee, Suwon-si (KR)

(73) Assignee: Samsung Electronics Co., Suwon-si, Gyeonggi-do (KR)

(*) Notice: Subject to any disclaimer, the term of this patent is extended or adjusted under 35 U.S.C. 154(b) by 791 days.

This patent is subject to a terminal disclaimer.

(21) Appl. No.: 11/249,082

(22) Filed: Oct. 12, 2005

(65) Prior Publication Data

US 2006/0150138 A1    Jul. 6, 2006

(30) Foreign Application Priority Data

Jan. 6, 2005    (KR)    ...................... 10-2005-0001124

(51) Int. Cl.
*H04L 12/50* (2006.01)
(52) U.S. Cl. ...................................................... 370/386
(58) Field of Classification Search ........................ None
See application file for complete search history.

(56) References Cited

U.S. PATENT DOCUMENTS 5,974,487 A    10/1999    Hartmann

| | | | |
|---|---|---|---|
| 6,331,977 B1 | 12/2001 | Spaderna et al. | |
| 7,145,903 B2* | 12/2006 | Gutierrez | 370/362 |
| 7,461,361 B2* | 12/2008 | Rhee | 716/2 |
| 2007/0239966 A1* | 10/2007 | Georgiou et al. | 712/28 |

FOREIGN PATENT DOCUMENTS

KR    03056567    7/2003

OTHER PUBLICATIONS

English Abstract***.
Shashi Kumar, et al., "A Network on Chip Architecture and Design Methodolgy" *Proceeding of the Society Annual Symposium on VLSI.*

* cited by examiner

*Primary Examiner*—Duc C Ho
(74) *Attorney, Agent, or Firm*—F. Chau & Associates, LLC

(57) ABSTRACT

Provided are a method of creating an optimized tile-switch mapping architecture in an on-chip bus, and a computer readable recording medium for recording the method. The method of creating a tile-switch mapping architecture includes first, second and third calculating steps. The method of creating a tile-switch mapping architecture minimizes the hop distance between cores when the mapping relationship between cores and tiles is determined, to thereby minimize energy consumption and communication delay time in an on-chip bus. Furthermore, the method of creating a tile-switch mapping architecture presents a standard for comparing the optimization of other mapping architectures.

18 Claims, 4 Drawing Sheets

2-D MESH NoC ARCHITECTURE

METHOD OF CREATING OPTIMIZED TILE-SWITCH MAPPING ARCHITECTURE IN ON-CHIP BUS AND COMPUTER-READABLE MEDIUM FOR RECORDING THE SAME

CROSS-REFERENCE TO RELATED PATENT APPLICATION

This application claims the benefit of Korean Patent Application No. 10-2005-0001124, filed on Jan. 6, 2005, in the Korean Intellectual Property Office, the disclosure of which is incorporated herein in its entirety by reference.

BACKGROUND OF THE INVENTION

1. Field of the Invention

The present invention relates to a method of creating an optimized tile-switch mapping architecture in an on-chip bus of a system-on-chip (SoC), and more particularly, to a method of creating an optimized mapping architecture between tiles and switches in a mesh-based on-chip bus, which reduces the energy and the communication delay time required for the communication between cores of an SoC, and a recording medium for recording the method.

2. Description of the Related Art

Conventional chip sets, where separate chips each execute their own functions, are evolving toward SoC technology, where various functional blocks are integrated on a single chip. The SoC integrates a variety of functional blocks called cores on a single chip, including a microprocessor, an on-chip memory, an audio and video controller, a CODEC and a digital signal processor, so as to reduce the size of a product and to decrease the development time and cost.

The cores constituting the SoC can be separately developed, if required. Otherwise, cores that have been developed by specialized developers can be used. This reusability of cores can reduce the time and cost required for developing them.

Sometimes, cores of an SoC require a high data bandwidth, which increases the burden on the transmission and reception of data among the cores. For example, in the case of an SoC including a large-capacity on-chip memory and a controller for processing audio and video signals or a CODEC, considerable time and cost are required for designing the architecture of the data transmission and reception between the functional block cores in the chip.

Generally, buses are used for transferring data between a large number of chips. In an embedded system using an ARM (Acorn RISC Machine) CPU, for example, components such as the CPU, a memory controller and a display controller are interconnected using a bus architecture such as AMBA (Advanced Microprocessor Bus Architecture).

The SoC has been evolving toward the integration of cores on a single chip, and the interconnection of the cores has been developing toward using the bus architecture. Thus, a conventional low-integration SoC employs a chip-level bus architecture without modification. However, as the integration of the SoC is increased, the wires of the bus become narrower, and the characteristics of the wires, such as inductance, resistance and capacitance become significant compared to the sizes of gates constituting the cores. Accordingly, it is difficult to obtain the desired system performance when the conventional bus architecture is applied to the SoC.

Therefore, a network-on-chip (NoC) has been developed, which is a technical field including efficient on-chip bus architecture and design methodology for the SoC, and on-chip buses in a variety of architectures have been recently proposed.

FIG. 1 illustrates a conventional on-chip bus architecture. This on-chip bus architecture 100 was obtained by modifying a part of the bus architecture disclosed in U.S. Pat. No. 5,974,487, assigned to Advanced Micro Devices, Inc. The on-chip bus architecture 100 can be used for an SoC including nine cores.

Referring to FIG. 1, the on-chip bus architecture 100 includes nine cores 110*a* through 110*i*, which are the various functional blocks, switches 120*a* through 120*l*, which are used for communication between the cores 110*a* through 110*i*, and links 130*a* through 130*l* and 131*a* through 131*h*, which are used for interconnecting the switches 120*a* through 120*l*. The links 130*a* through 130*l* and 131*a* through 131*h* and the switches 120*a* through 120*l* are configured in a ring topology, the rings of which form a two-dimensional mesh of the bus architecture. The switches 120*a* through 120*l* are positioned at the intersections of the mesh of rings. Each switch receives data from one switch through a link, and transfers it to another switch through another link. Furthermore, each switch transfers data through a link to a core, and transfers data from the core to other cores via other switches.

Here, a link can connect switches bi-directionally or uni-directionally. A bi-directional link can be constructed of a pair of uni-directional wires that transfer data in opposite directions. Otherwise, the bi-directional link can be comprised of a single wire.

When a first core 110*a* has data that must be transmitted to a second core 110*e*, the first core 110*a* transmits the data to a first switch 120*a*. The first switch 120*a* transfers the data received from the first core 110*a* through a first link 131*a* to a second switch 120*d*. Finally, the second switch 120*d* transfers the data received through the first link 131*a* to the second core 110*e*. That is, in the on-chip bus architecture 100 of FIG. 1, data transmission and reception between cores is carried out through links connecting switches connected to the cores.

FIG. 2 illustrates mapping among cores, tiles and switches. FIG. 2 includes a core-communication graph and an NoC architecture. The core-communication graph determines cores 210 which will be interconnected in order to construct the on-chip bus architecture 100 of FIG. 1. In FIG. 2, a first core s is connected to second and third cores d and d'.

The NoC architecture includes a plurality of switches 230, a plurality of tiles 220, and a plurality of links connecting the plurality of switches 230, and determines the connection of the tiles 220 and the switches 230. The tiles 220 are spaces where the cores are mounted, and are connected to the switches 230.

In FIG. 2, the first core s is mapped to a first tile k, the second core d is mapped to a second tile l, and the third core d' is mapped to a third tile l'. One of switches abutting the first tile k is a first switch i, and one of the switches abutting the second tile l is a second switch j. FIG. 2 shows first and second data communication routes x and y from the first switch i to the second switch j.

In the construction of the on-chip bus architecture 100 of FIG. 1, it is important which switches are connected to which tiles if the mapping relationship between the cores and the tiles is already determined. Energy consumption and communication delay time for the transmission and reception of data between connected cores in the mesh-based on-chip bus architecture are proportional to the hop distance between the connected cores. Accordingly, a tile-switch mapping method capable of minimizing the hop distance required for the transmission and reception of data is desired. However, conventional tile-switch mapping methods consider only one-to-one mapping between tiles and switches.

Furthermore, the conventional mapping methods do not propose an optimized mapping architecture for reducing energy consumption and communication delay time required for the transmission and reception of data between cores. Accordingly, a tile-switch mapping method is desired that determines the mapping relationship between cores and switches to minimize the hop distance desired for the transmission and reception of data between cores to thereby minimize energy consumption and communication delay time.

SUMMARY OF THE INVENTION

The present invention provides a method of creating a tile-switch mapping architecture for minimizing a hop distance between connected cores while creating a mapping relationship between cores and tiles.

The present invention also provides a recording medium for recording a method of creating a tile-switch mapping architecture for minimizing the hop distance between connected cores while creating a mapping relationship between cores and tiles.

According to an aspect of the present invention, there is provided a method of creating a tile-switch mapping architecture in an on-chip bus, which, by using a predetermined optimized mapping method, maps to switches tiles that have been mapped to cores.

The optimized mapping method includes first, second and third calculating steps.

The first step multiplies a data communication flow from an arbitrary first tile k to an arbitrary second tile l by a hop distance value between arbitrary first and second switches i and j. In the first step, the hop distance value of the first and second switches i and j is changed to the hop distance values of switches abutting the first tile k and switches abutting the second tile l, the multiplication is carried out for the changed hop distance values, and then the multiplication result values are summed.

The second step multiplies a communication volume from an arbitrary first core s to an arbitrary second core d by the summation result value of the first step, when the first core s is mapped to the first tile k and the second core d is mapped to the second tile l. In the second step, proximity index values of the first and second tiles k and l are changed to the proximity index values of all tiles, the multiplication is carried out for the changed proximity index values, and then the multiplication result values are summed.

The third step carries out the calculation of the second step for all cores and sums the calculation result values, to thereby determine which of the first and second tiles k and l minimize the hop distance between the first and second switches i and j.

The optimized mapping method further includes a fourth step of dividing the summation result of the third step by a communication volume between the first and second cores s and d, which has been carried out for all cores, to determines which of the first and second tiles k and l minimize the average hop distance between the first and second switches i and j.

The first through fourth steps assume that the first switch i, which is one of the switches abutting the first tile k, is connected to the first tile k and the second switch j, which is one of the switches abutting the second tile l, is connected to the second tile l, when the first core s is mapped to the first tile k and the second core d is mapped to the second tile l.

The optimized mapping method is represented by $$\frac{1}{\sum_{\forall s,d} v_{sd}} \sum_{\forall s,d} \sum_{\forall k,l} v_{sd}^{kl} \sum_{\forall i \in S_k, \forall j \in S_l} h_{ij} f_{kl}^{ij},$$

where $f_{kl}^{ij}$ represents the data communication flow, $h_{ij}$ denotes the hop distance between the first and second switches i and j, $S_k$ and $S_l$ respectively represent the switches abutting the first tile k and the switches abutting the second tile l, and $v_{sd}^{kl}$ denotes the communication volume between the first and second cores s and d when the first core s is mapped to the first tile k and the second core d is mapped to the second tile l.

The number of cores is equal to or less than the number of tiles, and no more than one core is mapped to a single tile. The switches and tiles form an NoC architecture interconnected by a plurality of links, and the NoC architecture has a two-dimensional mesh structure.

The number of switches connected to a single core is greater than 1 and less than 4. The relationship between the cores and switches is represented by $$1 \le \sum_{\forall i \in S_k} m_{ki} \le D_c,$$

where $D_c$ denotes the maximum number of switches connected to a single core, $m_{ki}$ is 1 if the switch i is connected to the first tile k to which the first core s is mapped but 0 otherwise, and $S_k$ represents the switches abutting the first tile k.

The number of cores connected to a single switch is greater than 1 and less than 4. The relationship between the cores and switches is represented by $$0 \le \sum_{\forall k \in T_i} m_{ki} \le D_s,$$

where $D_s$ denotes the maximum number of cores connected to a single switch, $m_{ki}$ is 1 if the first switch i is connected to the first tile k to which the first core s is mapped but 0 otherwise, and $T_i$ represents the tiles abutting the first switch i.

The data communication flow is 1 if the first tile k to which the first core s is mapped is connected to the first switch i and the second tile l to which the second core d is mapped is connected to the second switch j, but 0 otherwise. The data communication flow is represented by $$f_{kl}^{ij} \le m_{ki},$$
$$f_{kl}^{ij} \le m_{lj},$$
$$\sum_{\forall i \in S_k, \forall j \in S_l} f_{kl}^{ij} = 1,$$

where $f_{kl}^{ij}$ denotes the data communication flow, $m_{ki}$ represents the case where the first switch i is connected to the first tile k to which the first core s is mapped, and $m_{lj}$ represents the case where the second switch j is connected to the second tile l to which the second core d is mapped.

The bandwidth of an arbitrary link must be less than or equal to the maximum bandwidth that can be simultaneously maintained in the link, and the maximum bandwidth of the link must not exceed the link capacity. The bandwidth of the arbitrary link is represented by $$\sum_{\forall k,l} \sum_{\forall i \in S_k, \forall j \in S_l} b_{sd} r_{xy}^{ij} f_{kl}^{ij} = B_{xy},$$

$$B_{xy} \le B_{max},$$

$$B_{max} \le C,$$

where $B_{xy}$ is the bandwidth of the link between arbitrary first and second routes X and Y between the first and second switches i and j, $b_{sd}$ denotes the bandwidth required for the data communication flow from the first core s to the second core d, $B_{max}$ represents the maximum bandwidth that can be simultaneously maintained in the arbitrary link, and C denotes the link capacity that is the maximum data capacity that the arbitrary link can transfer.

According to another aspect of the present invention, there is provided a computer readable recording medium for recording a method of creating an optimized tile-switch mapping architecture in an on-chip bus, which, by using a predetermined optimized mapping method, maps tiles to switches that have been mapped to cores. The computer readable recording medium records the tile-switch mapping architecture creating method that performs a first step of multiplying a data communication flow from an arbitrary first tile k to an arbitrary second tile l by a hop distance value between arbitrary first and second switches i and j, in which the hop distance value of the first and second switches i and j is changed to the hop distance values of switches abutting the first tile k and switches abutting the second tile l, the multiplication is carried out for the changed hop distance values, and then the multiplication result values are summed; a second step of multiplying a communication volume from an arbitrary first core s to an arbitrary second core d by the summation result value of the first step when the first core s is mapped to the first tile k and the second core d is mapped to the second tile l, in which proximity index values of the first and second tiles k and l are changed to the proximity index values of all tiles, the multiplication is carried out for the changed proximity index values, and then the multiplication result values are summed; and a third step of carrying out the calculation of the second step for all cores and summing the calculation result values, to thereby determine which of the first and second tiles k and l minimize the hop distance between the first and second switches i and j.

The computer readable recording medium can further record a fourth step of dividing the summation result of the third step by a communication volume between the first and second cores s and d, which has been carried out for all cores, to determine which of the first and second tiles k and l minimize the average hop distance between the first and second switches i and j.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF PREFERRED EMBODIMENTS

Figure 1:
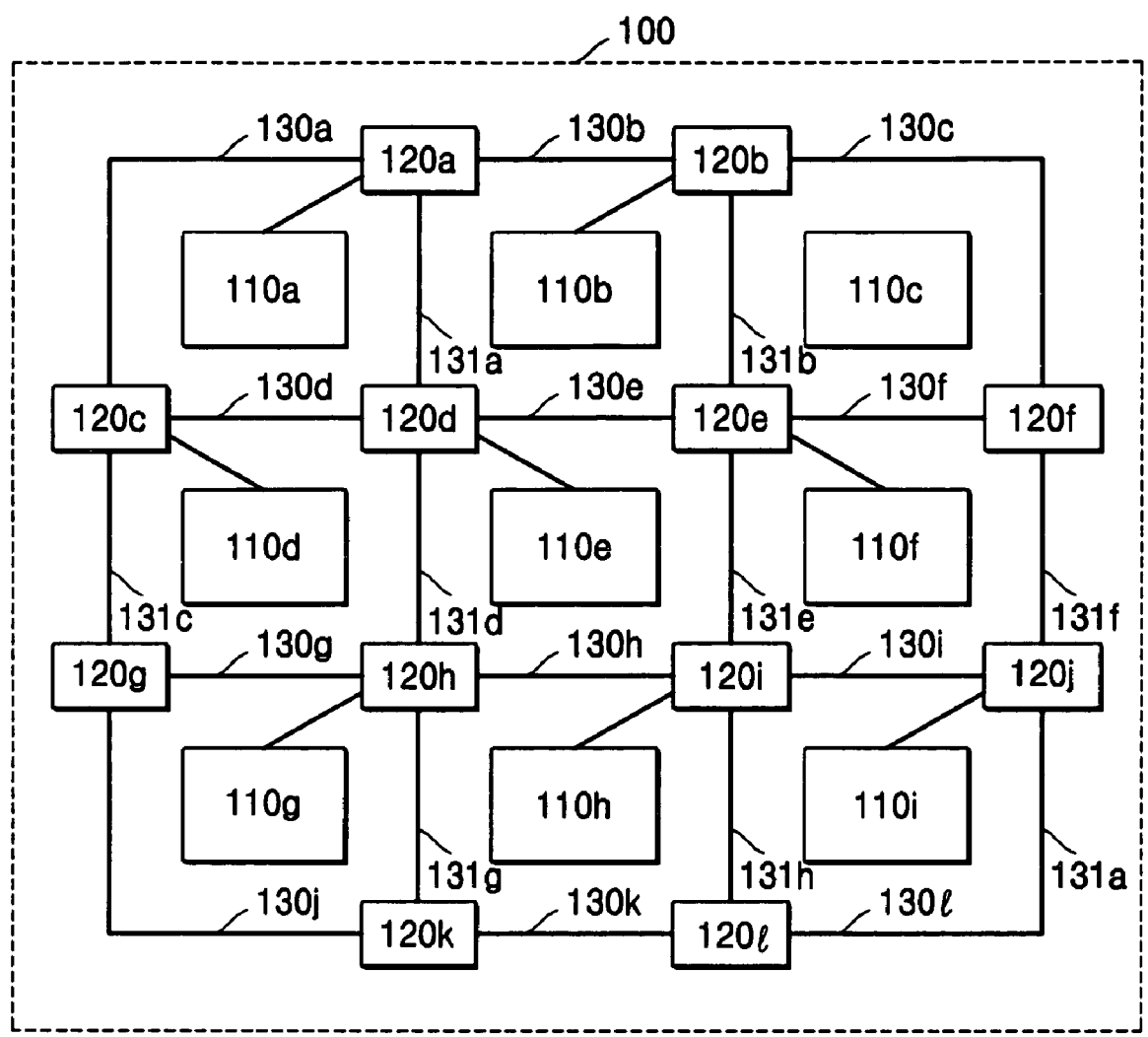
FIG. 1 illustrates a conventional on-chip bus architecture.
Figure 2:
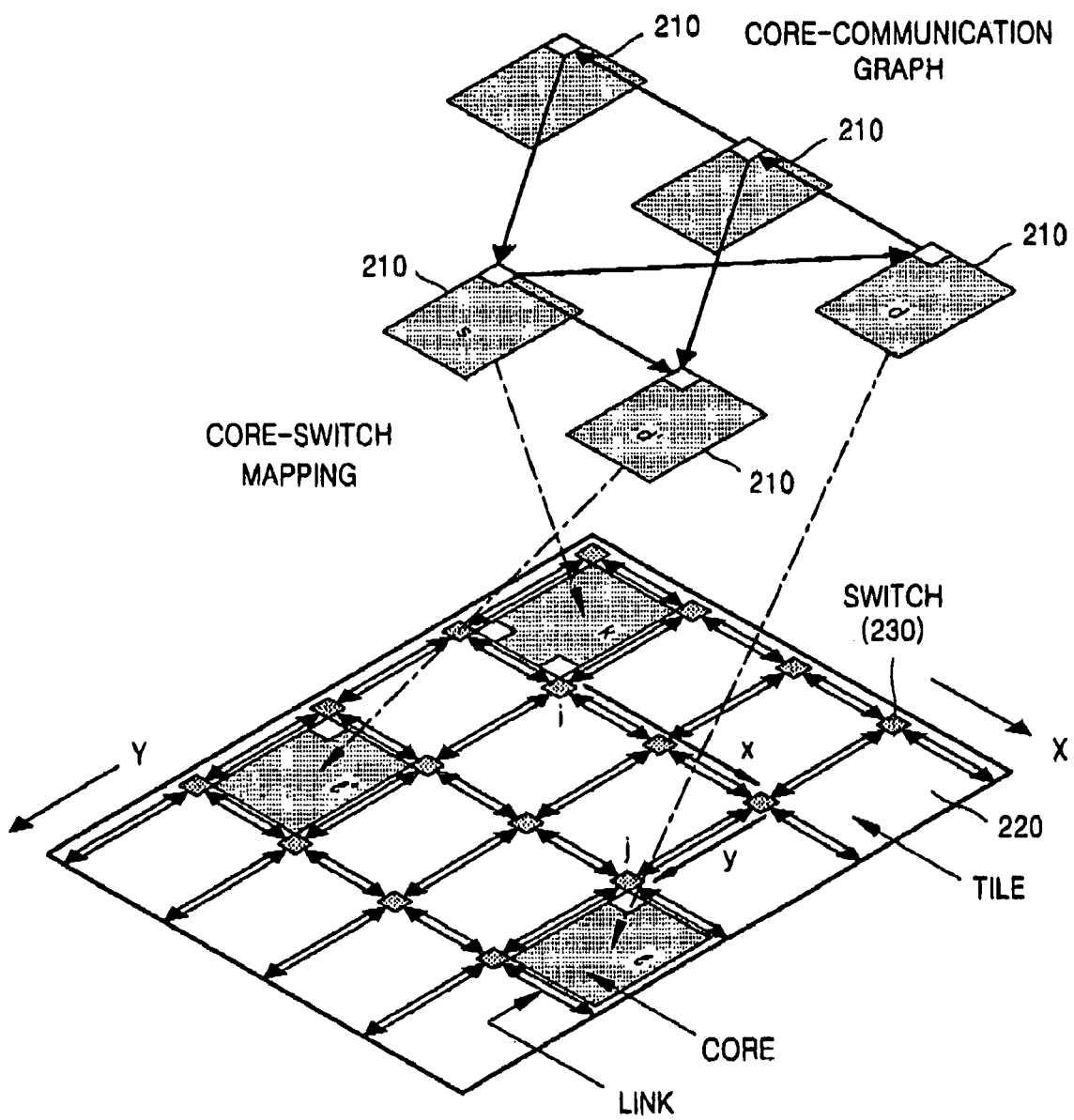
FIG. 2 illustrates mapping between cores, tiles and switches.
Figure 3:
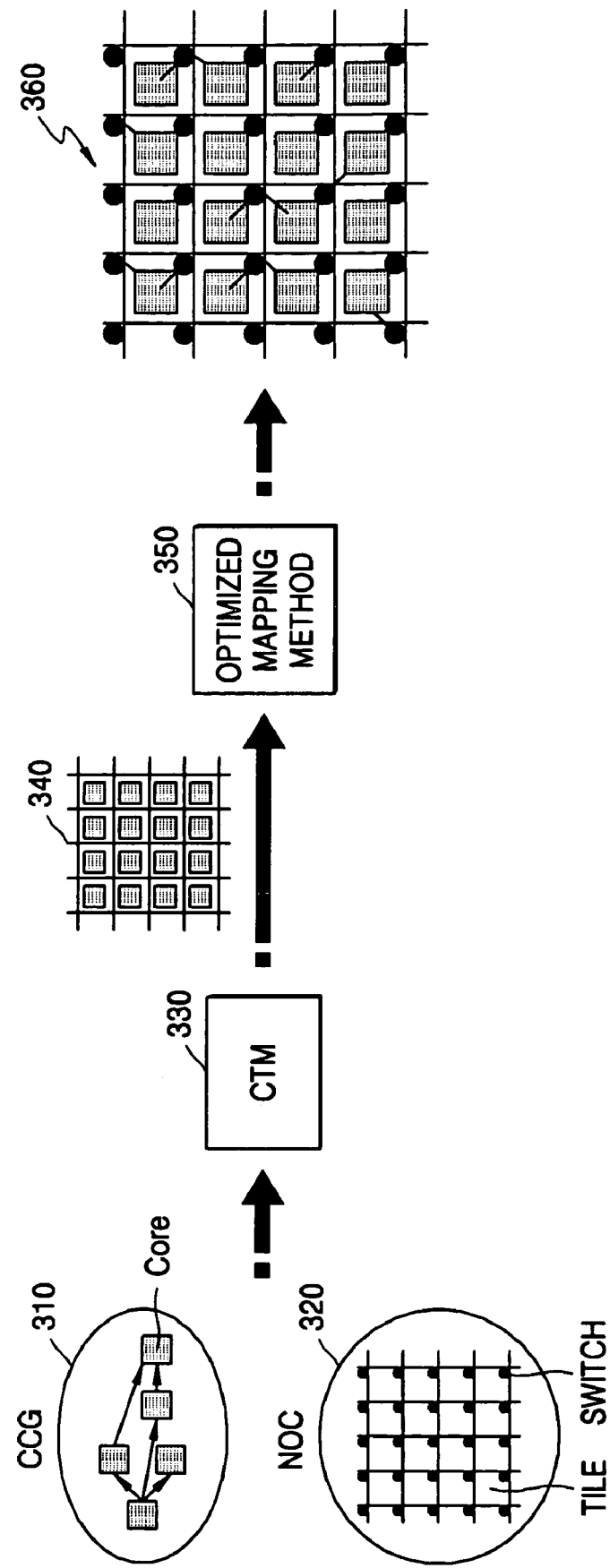
FIG. 3 illustrates a method of creating a tile-switch mapping architecture according to an exemplary embodiment of the present invention.

FIG. 3 illustrates a method of creating a tile-switch mapping architecture according to an exemplary embodiment of the present invention.

Referring to FIG. 3, a core communication graph (CCG) 310 representing the connection of cores is created. The connection of cores is determined at the request of an SoC designer. A case where a first core s is connected to a second core d will be explained as an example.

A network-on-chip architecture (NOC) 320 including a plurality of switches, a plurality of tiles and a plurality of links connecting the switches is created. For the convenience of explanation assume that the NOC 320 is a two-dimensional mesh. However, the NOC 320 is not limited to a two-dimensional mesh.

When the CCG 310 and the NOC 320 are created, a core-tile mapping architecture 340 is created, in which cores and tiles are mapped by a conventional core-tile mapping method (CTM) 330. For the convenience of explanation assume that the first core s is mapped to a first tile k, and the second core d is mapped to a second tile l.

When the core-tile mapping architecture 340 is created, the cores are mapped to switches using a predetermined optimized mapping method 350, to create an optimized tile-switch mapping architecture 360. In the tile-switch mapping architecture 360 created by the optimized mapping method 350, the hop distance between the first core s and the second core d is minimized, and the energy and the communication delay time required when data is transmitted and received are minimized.

The optimized mapping method 350 will now be explained in more detail with reference to FIG. 4, which is a flow chart of the method of creating a tile-switch mapping architecture of FIG. 3.

Figure 4:
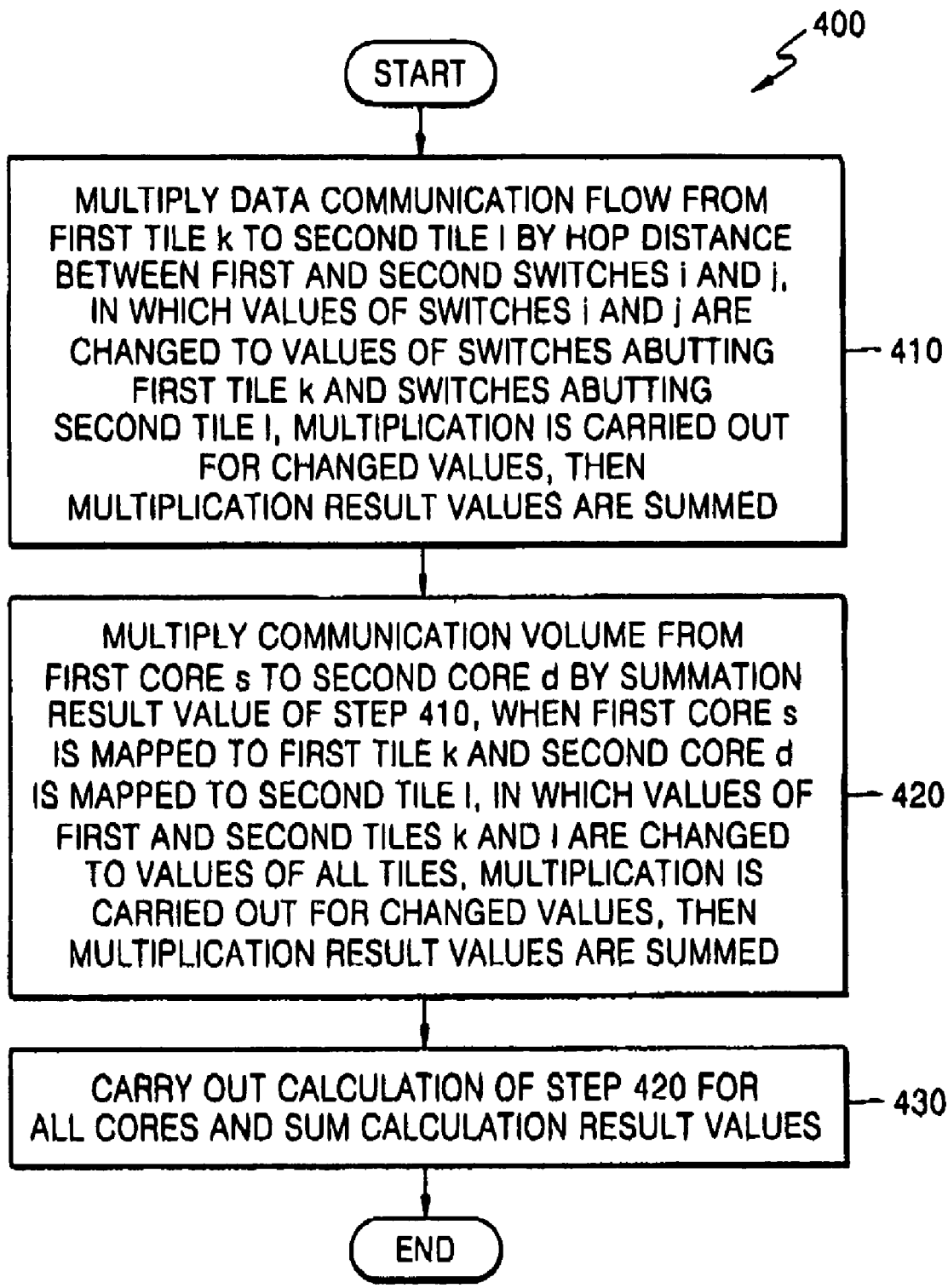
FIG. 4 is a flow chart of the method of creating a tile-switch mapping architecture of FIG. 3.

Referring to FIG. 4, the optimized mapping method 350 includes first, second and third calculation steps. For the convenience of explanation assume that the optimized tile-switch mapping architecture is obtained when the first core s is mapped to the first tile k, the second core d is mapped to the second tile l, a first switch i, one of the switches abutting the first tile k, is connected to the first tile k, and a second switch j, one of the switches abutting the second tile l, is connected to the second tile l.

It is assumed that the optimized tile-switch mapping architecture is obtained when the first tile k to which the first core s is mapped is connected to the first switch i and the second tile l to which the second core d is mapped is connected to the second switch j. A proximity index value is used to indicate the proximity of a switch to a tile or a core to a tile. The proximity index values will indicate whether or not a particular switch abuts a particular tile or if a particular core is mapped to a particular tile.

The optimized mapping method 350 can be represented by Expression 1, $$\frac{1}{\sum_{\forall s,d} v_{sd}} \sum_{\forall s,d} \sum_{\forall k,l} v_{sd}^{kl} \sum_{\forall i \in S_k, \forall j \in S_l} h_{ij} f_{kl}^{ij}.$$

A plurality of result values are obtained when the calculation according to Expression 1 is carried out while varying proximity index values of the first and second cores s and d, and the first and second tiles k and l, and the hop distance value between the first and second switches i and j. These result values correspond to hop distances between the first and second cores s and d. Accordingly, the proximity index values of the first and second cores s and d, and of the first and second tiles k and l, and the hop distance values of the first and second switches i and j, which can obtain the minimum value of the result values, form the optimized mapping architecture.

The first step 410 of creating the optimized tile-switch mapping architecture using the optimized mapping method 350 will now be explained.

The first step 410 multiplies the data communication flow from the first tile k to the second tile l by the hop distance value between the first and second switches i and j. Specifically, the first step 410 changes the hop distance value of the first and second switches i and j to the hop distance values of switches abutting the first tile k and the hop distance values of switches abutting the second tile l, carries out the multiplication for the changed hop distance values, and then sums the multiplication result values.

The first step performs the rightmost summing operation (sigma operation) of Expression 1. In Expression 1, $f_{kl}^{ij}$ represents the data communication flow and $h_{ij}$ denotes the hop distance value between the first and second switches i and j. In addition, $S_k$ and $S_l$ respectively represent the switches abutting the first tile k and the switches abutting the second tile l. There may be a plurality of switches that abut the first and second tiles k and l. The first and second switches i and j are selected from the switches abutting the first and second tiles k and l to calculate the data communication flow and the hop distance value, and the two terms are multiplied together. Then, the hop distance value of the first and second switches i and j is changed to the hop distance values of the switches abutting the first and second tiles k and l, the data communication flow and the hop distance value for the changed hop distance values are calculated, and the data communication flow is multiplied by the hop distance value.

When the NoC architecture is a two-dimensional mesh as in the embodiment of the present invention, there are four switches abutting each of the first and second tiles k and l. Thus, four result values are obtained when the calculation of the first step is carried out for the first and second switches i and j, and the four result values are summed according to the summing operation (sigma operation).

The data communication flow has the value 1 if the first tile k to which the first core s is mapped is connected to the first switch i and the second tile l to which the second core d is mapped is connected to the second switch j, but has the value 0 otherwise.

The case where the first switch i is mapped to the first tile k to which the first core s is connected and the second switch j is mapped to the second tile l to which the second core d is connected has been assumed to be the optimized tile-switch mapping architecture. Accordingly, the data communication flow has the value 1 only in the optimized tile-switch mapping architecture but has the value 0 in other architectures.

The data communication flow can be represented by Expression 2, $$f_{kl}^{ij} \leq m_{ki},$$
$$f_{kl}^{ij} \leq m_{lj},$$
$$\sum_{\forall i \in S_k, \forall j \in S_l} f_{kl}^{ij} = 1,$$

where $f_{kl}^{ij}$ denotes the data communication flow, $m_{ki}$ represents the case where the first switch i is connected to the first tile k to which the first core s is mapped, and $m_{lj}$ represents the case where the second switch j is connected to the second tile l to which the second core d is mapped.

Here, $m_{ki}$ and $m_{lj}$ have the value 1 if the first tile k to which the first core s is mapped is connected to the first switch i and the second tile l to which the second core d is mapped is connected to the second switch j, but have the value 0 otherwise. Accordingly, the data communication flow becomes 1 in the optimized architecture in which the first tile k to which the first core s is mapped is connected to the first switch i and the second tile l to which the second core d is mapped is connected to the second switch j.

The second step 420 multiplies the communication volume between the first core s and the second core d by the result value of the first step, when the first core s is mapped to the first tile k and the second core d is mapped to the second tile l. Specifically, the second step changes proximity index values of the first and second tiles k and l to the proximity index values of all tiles, carries out the multiplication for the changed tile proximity index values, and sums the multiplication result values.

The second step 420 performs the second summing operation (sigma operation) of Expression 1 including the calculation of the first step. In Expression 1, the communication volume between the first and second cores s and d is represented by $v_{sd}^{kl}$ when the first core s is mapped to the first tile k and the second core d is mapped to the second tile l.

The calculation of the first step is carried out while changing proximity index values of the first and second tiles k and l to the proximity index values of all tiles. Then, the hop distance value and communication data flow are calculated for all tiles and all switches abutting the tiles, and the two terms are multiplied together. Each of the multiplication result values is multiplied by the communication volume $v_{sd}^{kl}$ that is obtained while changing the proximity index values of the first and second tiles k and l to the proximity index values of all tiles. The communication volume relates to the quantity of data communication between the first core s and the second core d, and functions as a weight value.

The third step 430 carries out the calculation of the second step for all cores, and then sums the calculation result values. The third step 430 performs the third summing operation (sigma operation) of Expression 1, including the operation of the second step 420.

Specifically, the calculations of the first and second steps are carried out while changing the proximity index values of the first and second cores s and d to the proximity index values of all cores. Then, the hop distance, data communication flow and communication volume are calculated for all cores, all tiles and all switches abutting the tiles. The result values obtained through these calculations are summed to acquire the minimum hop distance between the first switch i and the second switch j. Here, the first switch i is connected to the first tile k to which the first core s is mapped, and the second switch j is connected to the second tile l to which the second core d is mapped. The architecture of mapping the cores, tiles and switches which corresponds to the minimum hop distance forms the optimized tile-switch mapping architecture capable of minimizing energy consumption and communication delay time.

The optimized mapping method 350 can further include a fourth step that divides the result of the third step by the communication volume between the first and second cores s and d, which has been carried out for all cores, to determine the first and second tiles k and l for which the average hop distance between the first and second switches i and j is minimum.

The first through fourth steps are executed under the following conditions.

Restrictions on the mapping of cores and tiles are described. The number of cores is equal to or less than the number of tiles, and no more than one core is mapped to a single tile. That is, one core is mapped to one tile. On the other hand, one tile can be mapped to one core or not mapped to any core.

Restrictions on cores and switches will now be explained.

The number of switches connected to a single core is greater than 1 and less than 4. This means that the number of switches connected to a single tile is also greater than 1 and less than 4. The relationship between tiles and switches is represented by Expression 3, $$1 \leq \sum_{\forall i \in S_k} m_{ki} \leq D_c,$$

where $D_c$ denotes the maximum number of switches connected to a single core, and $1 \leq D_c \leq 4$ when the NoC has a two-dimensional mesh architecture. In addition, $m_{ki}$ is 1 if the first switch i is connected to the first tile k to which the first core s is mapped, and $m_{ki}$ is 0 otherwise, and $S_k$ represents the switches abutting the first tile k. The term $$\sum_{\forall i \in S_k} m_{ki}$$

of Expression 3 becomes one value between 1 and 4 when the first core s is mapped to the first tile k. Thus, the number of switches connected to a single tile is larger than 1 and smaller than 4.

In addition, the number of cores connected to a single switch is larger than 1 and smaller than 4. This means that the number of tiles connected to a single switch is greater than 1 and less than 4. The relationship between cores and switches is represented by Expression 4, $$0 \leq \sum_{\forall k \in T_i} m_{ki} \leq D_s,$$

where $D_s$ denotes the maximum number of cores connected to a single switch, and $1 \leq D_s \leq 4$ when the NoC has a two-dimensional mesh architecture. In addition, $m_{ki}$ is 1 if the switch i is connected to the first tile k to which the first core s is mapped, and $m_{ki}$ is 0 otherwise, and $T_i$ represents the tiles abutting the first switch i.

The term $$\sum_{\forall k \in T_i} m_{ki}$$

of Expression 4 becomes one value between 0 to 4. Accordingly, the number of cores connected to a single switch is greater than 0 and less than 4.

Restrictions on a link bandwidth will now be explained.

The bandwidth of an arbitrary link should be less than or equal to the maximum bandwidth that can be simultaneously maintained in the link. Furthermore, the maximum bandwidth of the arbitrary link must not exceed the link capacity. The bandwidth of the link is represented by Expression 5, $$\sum_{\forall k,l} \sum_{\forall i \in S_k, \forall j \in S_l} b_{sd} r_{xy}^{ij} f_{kl}^{ij} = B_{xy},$$

$$B_{xy} \leq B_{max},$$

$$B_{max} \leq C,$$

where $B_{xy}$ means the bandwidth of the link between arbitrary first and second routes X and Y between the first and second switches i and j, and $b_{sd}$ denotes the bandwidth required for the data communication flow from the first core s to the second core d. In addition, $B_{max}$ represents the maximum bandwidth simultaneously maintained in the arbitrary link, and C denotes the link capacity that is the maximum data capacity that the arbitrary link can transfer.

The link between the first and second switches i and j connecting the first and second cores s and d must have a sufficient bandwidth for transmitting and receiving data. The bandwidth $B_{xy}$ of the link between the first and second routes X and Y must be smaller than the maximum bandwidth $B_{max}$. Furthermore, the maximum bandwidth $B_{max}$ must be smaller than the maximum data capacity C the link can transfer. In Expression 5, $r_{xy}^{ij}$ is 1 if the first and second routes X and Y exist between the first and second switches i and j, and 0 otherwise.

Based on the aforementioned conditions and the first through fourth steps, the optimized tile-switch mapping architecture capable of minimizing energy consumption and communication delay time can be found.

At least one method of the present invention is preferably embodied as computer readable code on a computer readable recording medium. The computer readable recording medium is any data storage device that can store data which can be thereafter read by a computer system. Examples of the computer readable recording medium include ROM, RAM, CD-ROM, magnetic tapes, floppy disks, optical data storage devices, and carrier waves (such as data transmission through the Internet). The computer readable recording medium can also be distributed over network coupled computer systems so that the computer readable code is stored and executed in a distributed fashion.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method of creating a tile-switch mapping architecture comprising:
   multiplying a data communication flow from an arbitrary first tile k to an arbitrary second tile l by a hop distance value between arbitrary first and second switches i and j, in which the hop distance value of the first and second switches i and j is changed to the hop distance values of switches abutting the first tile k and switches abutting the second tile l, the multiplication is carried out for the changed hop distance values:
   summing the data communication flow multiplication results;
   multiplying a communication volume from an arbitrary first core s to an arbitrary second core d by the summation of the data communication flow multiplication results, when the first core s is mapped to the first tile k and the second core d is mapped to the second tile l, in which proximity index values of the first and second tiles k and l are changed to the proximity index values of all tiles, the multiplication is carried out for the changed proximity index values;
   summing the communication volume multiplication results;
   carrying out the summation of the communication volume multiplication results calculations for all cores; and
   summing the calculations for all cores results, to thereby determine which of the first and second tiles k and l minimize the hop distance between the first and second switches i and j.

2. The method of claim 1, further comprising:
   dividing the summation of the calculations for all cores results by a communication volume between the first and second cores s and d, which has been carried out for all cores, to determine which of the first and second tiles k and l minimize the average hop distance between the first and second switches i and j.

3. The method of claim 2, wherein the method steps assume that the first switch i, which is one of the switches abutting the first tile k, is connected to the first tile k and the second switch j, which is one of the switches abutting the second tile l, is connected to the second tile l, when the first core s is mapped to the first tile k and the second core d is mapped to the second tile l.

4. The method of claim 3, wherein the method is represented by $$\frac{1}{\sum_{\forall s,d} v_{sd}} \sum_{\forall s,d} \sum_{\forall k,l} v_{sd}^{kl} \sum_{\forall i \in S_k, \forall j \in S_l} h_{ij} f_{kl}^{ij},$$

where $f_{kl}^{ij}$ represents the data communication flow, $h_{ij}$ denotes the hop distance between the first and second switches i and j, $S_k$ and $S_l$ respectively represent the switches abutting the first tile k and the switches abutting the second tile l, and $v_{sd}^{kl}$ denotes the communication volume between the first and second cores s and d when the first core s is mapped to the first tile k and the second core d is mapped to the second tile l.

5. The method of claim 3, wherein the number of cores is equal to or less than the number of tiles, and no more than one core is mapped to a single tile.

6. The method of claim 3, wherein the switches and tiles form a network-on-chip (NoC) architecture interconnected by a plurality of links, and the NoC architecture has a two-dimensional mesh structure.

7. The method of claim 3, wherein the number of switches connected to a single core is greater than 1 and less than 4.

8. The method of claim 7, wherein the relationship between the cores and switches is represented by $$1 \leq \sum_{\forall i \in S_k} m_{ki} \leq D_c,$$

where $D_c$ denotes the maximum number of switches connected to a single core, $m_{ki}$ is 1 if the switch i is connected to the first tile k to which the first core s is mapped, but 0 otherwise, and $S_k$ represents the switches abutting the first tile k.

9. The method of claim 3, wherein the number of cores connected to a single switch is greater than 1 and less than 4.

10. The method of claim 9, wherein the relationship between the cores and switches is represented by $$0 \leq \sum_{\forall k \in T_i} m_{ki} \leq D_s,$$

where $D_s$ denotes the maximum number of cores connected to a single switch, $m_{ki}$ is 1 if the switch i is connected to the first tile k to which the first core s is mapped, but 0 otherwise, and $T_i$ represents the tiles abutting the first switch i.

11. The method of claim 3, wherein the data communication flow is 1 if the first tile k to which the first core s is mapped is connected to the first switch i and the second tile l to which the second core d is mapped is connected to the second switch j, but 0 otherwise.

12. The method of claim 11, wherein the data communication flow is represented by $$f_{kl}^{ij} \leq m_{ki},$$
$$f_{kl}^{ij} \leq m_{lj},$$
$$\sum_{\forall i \in S_k, \forall j \in S_l} f_{kl}^{ij} = 1,$$

where $f_{kl}^{ij}$ denotes the data communication flow, $m_{ki}$ represents the case where the first switch i is connected to the first tile k to which the first core s is mapped, and $m_{lj}$ represents the case where the second switch j is connected to the second tile l to which the second core d is mapped.

13. The method of claim 3, wherein the bandwidth of an arbitrary link must be less than or equal to the maximum bandwidth that can be simultaneously maintained in the link, and the maximum bandwidth of the link must not exceed the link capacity.

14. The method of claim 13, wherein the bandwidth of the arbitrary link is represented by $$\sum_{\forall k,l} \sum_{\forall i \in S_k, \forall j \in S_l} b_{sd} r_{xy}^{ij} f_{kl}^{ij} = B_{xy},$$
$$B_{xy} \leq B_{max},$$
$$B_{max} \leq C,$$

where $B_{xy}$ is the bandwidth of the link between arbitrary first and second routes X and Y between the first and second switches i and j, $b_{sd}$ denotes the bandwidth required for the data communication flow from the first core s to the second core d, $B_{max}$ represents the maximum bandwidth that can be simultaneously maintained in the arbitrary link, and C denotes the link capacity that is the maximum data capacity that the arbitrary link can transfer.

15. A computer-readable volatile and non-volatile medium encoded with a computer program executable by a computer to perform method steps of creating a tile-switch mapping architecture comprising:

multiplying a data communication flow from an arbitrary first tile k to an arbitrary second tile l by a hop distance value between arbitrary first and second switches i and j, in which the hop distance value of the first and second switches i and j is changed to the hop distance values of switches abutting the first tile k and switches abutting the second tile l, the multiplication is carried out for the changed hop distance values;

summing the data communication flow multiplication results;

multiplying a communication volume from an arbitrary first core s to an arbitrary second core d by the summation of the data communication flow multiplication results, when the first core s is mapped to the first tile k and the second core d is mapped to the second tile l, in which proximity index values of the first and second tiles k and l are changed to the proximity index values of all tiles, the multiplication is carried out for the changed proximity index values;

summing the communication volume multiplication results;

carrying out the summation of the communication volume multiplication results calculations for all cores; and summing the calculations for all cores results, to thereby determine the first and second tiles k and l which minimize the hop distance between the first and second switches i and j.

16. The computer readable volatile and non-volatile medium of claim 15, further comprising:

dividing the summation of the calculations for all cores results by a communication volume between the first and second cores s and d, which has been carried out for all cores, to determine which of the first and second tiles k and l minimize the average hop distance between the first and second switches i and j.

17. A method of creating a tile-switch mapping architecture comprising:

calculating a sum of products of data communication flow and hop distance between switches abutting tiles;

calculating a sum of products of data communication volumes and the sum of products of data communication flow and hop distance between switches abutting tiles for tiles mapped to cores;

repeating the step of calculating a sum of products of data communication volumes and the sum of products of data communication flow and hop distance between switches abutting tiles for tiles mapped to cores for all cores; and summing the calculations for all cores results, to determine a minimum hop distance between switches.

18. The method of claim 17, further comprising:

dividing the summation of the calculations for all cores results by a communication volume between cores, which has been carried out for all cores, to determine which tiles minimize the average hop distance between switches.

* * * * *